United States Patent
Yang et al.

(10) Patent No.: US 9,469,525 B2
(45) Date of Patent: Oct. 18, 2016

(54) MODIFIED SURFACE FOR BLOCK COPOLYMER SELF-ASSEMBLY

(75) Inventors: XiaoMin Yang, Livermore, CA (US); Wei Hu, Newark, CA (US); Zhaoning Yu, Palo Alto, CA (US); Justin Jia-Jen Hwu, Fremont, CA (US); Kim Yang Lee, Fremont, CA (US)

(73) Assignee: Seagate Technology LLC, Cupertino, CA (US)

(*) Notice: Subject to any disclaimer, the term of this patent is extended or adjusted under 35 U.S.C. 154(b) by 440 days.

(21) Appl. No.: 13/018,414

(22) Filed: Jan. 31, 2011

(65) Prior Publication Data

US 2012/0196089 A1   Aug. 2, 2012

(51) Int. Cl.

| | | |
|---|---|---|
| B81C 1/00 | (2006.01) | |
| G03F 7/00 | (2006.01) | |
| G03F 7/16 | (2006.01) | |
| B82Y 10/00 | (2011.01) | |
| B82Y 40/00 | (2011.01) | |

(52) U.S. Cl.
CPC ............ B81C 1/00031 (2013.01); B82Y 10/00 (2013.01); B82Y 40/00 (2013.01); G03F 7/0002 (2013.01); G03F 7/165 (2013.01); B81C 2201/0149 (2013.01); Y10T 428/24479 (2015.01)

(58) Field of Classification Search
CPC ... B81C 1/00031; G11B 5/743; G11B 5/746; G11B 5/82; G11B 5/855
See application file for complete search history.

(56) References Cited

U.S. PATENT DOCUMENTS

| | | |
|---|---|---|
| 6,746,825 B2 | 6/2004 | Nealey et al. |
| 7,622,367 B1 | 11/2009 | Nuzzo et al. |
| 7,790,350 B2 | 9/2010 | Breyta et al. |
| 2004/0241574 A1* | 12/2004 | Dai et al. .................. 430/270.1 |
| 2006/0134556 A1 | 6/2006 | Nealey et al. |
| 2007/0217075 A1* | 9/2007 | Kamata et al. ............... 360/135 |
| 2008/0102252 A1* | 5/2008 | Black .................. B81C 1/00031 428/173 |
| 2008/0176767 A1* | 7/2008 | Millward ........................ 506/20 |
| 2008/0311347 A1* | 12/2008 | Millward et al. ............. 428/144 |
| 2009/0092803 A1 | 4/2009 | Bita et al. |
| 2009/0196488 A1* | 8/2009 | Nealey ................ B81C 1/00031 382/145 |
| 2009/0240001 A1 | 9/2009 | Regner |
| 2009/0260750 A1 | 10/2009 | Nealey et al. |
| 2010/0124629 A1 | 5/2010 | Gopalan et al. |

FOREIGN PATENT DOCUMENTS

| | | |
|---|---|---|
| JP | 2006120222 A | 5/2006 |
| JP | 2007301839 | 11/2007 |
| JP | 2008090956 | 4/2008 |

(Continued)

OTHER PUBLICATIONS

Gabor et al., Synthesis and Lithographic Characterization of Block Copolymer Resists Consisting of both Polystyrene Blocks and Hydrosiloxane-Modified Polydiene Blocks, Chem. Mater, 1994, 6, 927-934.*

(Continued)

*Primary Examiner* — Francisco Tschen

(57) ABSTRACT

A method of self-assembling density multiplied block copolymers (BCP) structures includes applying a block copolymer (BCP) to a feature-imprinted resist layer. The BCP is thermally annealed to laterally segregate the BCP into self-assembled columns of a first polymer block surrounded by a second polymer block.

17 Claims, 8 Drawing Sheets

(56) References Cited

FOREIGN PATENT DOCUMENTS

| JP | 2010056257 | 3/2010 |
|----|------------|--------|
| JP | 2010123239 | 6/2010 |

OTHER PUBLICATIONS

Darling, S., Directing the self-assembly of block copolymers, Prog. Polym Sci. 32 (2007), 1152-1204.*

Miller et al., "Step and Flash Imprint Process Integration Techniques for Photonic Crystal Patterning: Template Replication through Wafer Patterning Irrespective of Tone", *Advanced Fabrication Technologies for Micro/Nano Optics and Photonics,* Proceedings vol. 6883, Feb. 2008.

ISR and WO for related PCT/US2012/021780 mailed on Sep. 27, 2012.

International Preliminary Report on Patentability dated Aug. 15, 2013 in International Application No. PCT/US2012/021780. 5 pages.

* cited by examiner

MODIFIED SURFACE FOR BLOCK COPOLYMER SELF-ASSEMBLY

FIELD

The present disclosure relates to lithographic processes in device fabrication. More particularly, the disclosure relates to a method of forming high-density patterning to guide cylinder forming block copolymer (BCP) structure assembly.

BACKGROUND

Bit pattern media (BPM) has been extensively explored by the magnetic recording industry as one of several key solutions to expand perpendicular magnetic recording (PMR) technology in high density disk drives (HDDs). The storage capacity of BPM is dependent upon the density of the magnetic islands, or "bits" on the media substrate surface. Current processes for achieving high density patterned media include imprint mold fabrication, nano-imprinting and pattern transfer into magnetic dots, and the like. Self-assembling block copolymer (BCP) enables high-density lithographic bit patterning capability and is a promising material for BPM template fabrication. Directed self-assembly combines 'top-down' lithography (pre-registered pattern) and 'bottom-up' self-assembling materials like block copolymers. Directed self-assembly may generate ultra-high density homogenous patterns.

SUMMARY

In an embodiment, a method includes applying a block copolymer (BCP) to a feature imprinted resist layer, and thermally annealing the BCP to laterally segregate the BCP into self-assembled columns of a first polymer block surrounded by a second polymer block.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Disclosed is a method of guiding cylinder-forming P(S-b-MMA) block copolymer (BCP) using chemically-modified pillar-template topography. The pillar-template topography has a low density and can be readily accomplished with current lithography technology. An imprint resist into which the pillar-template is impressed may be "chemically neutral" with respect to cylinder forming BCP materials in order to control BCP structural orientation. That is, by chemically-neutral, the imprint resist has corresponding chemical components that match the BCP by having the same or similar chemical properties. The chemically-neutral surface can be obtained with spin coating neutral polymer brush materials, or using self-assembled monolayers (SAMs).

Figure 1A:
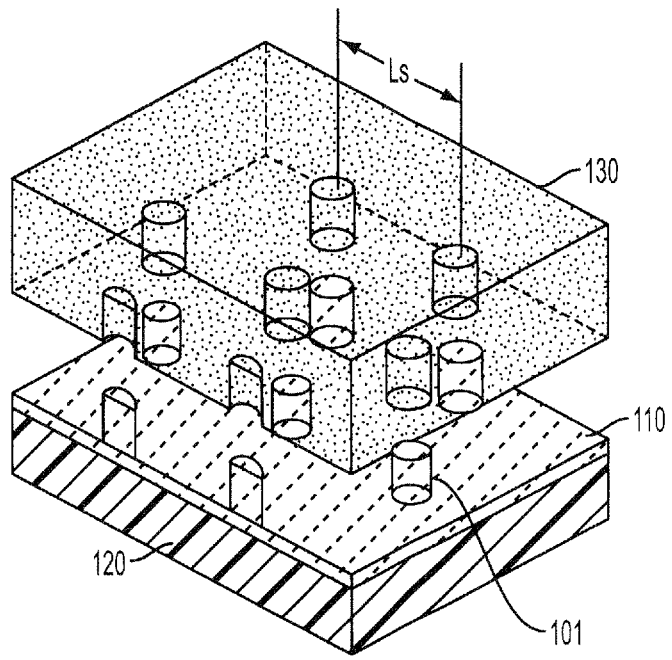
FIG. 1A illustrates a pillar pattern imprinted in a chemically neutral imprint resist, in accordance with an embodiment.

FIG. 1A illustrates a pattern of pillars 101 imprinted in a chemically-neutral imprint resist 110 formed on a substrate 120, where a master mold 130 for the imprint pattern is a mold which may be formed by various methods, such as e-beam lithography, ion milling, plasma etching, LIGA, chemical etching, and the like. The pitch distance between features, which in this example are pillars, is a distance $L_s$. The pillar height may be determined by the depth of the dimensions of the cylindrical holes formed in the master mold 130, as well as the pressure applied during imprinting, and the original thickness of the imprint resist. For example, the pillar height may be 5-30 nm; the pillar diameter may be 5-30 nm. The spacing $L_s$, as would be obvious to one of ordinary skill, would be larger than the diameter of the pillars, and the dimension is determined by additional specifications described below.

The pillar structure is formed in the imprint resist 110 by impressing the mold 130 into the imprint resist 110, where the imprint resist 110 is heated to reduce its viscosity and facilitate formation of the pillars 101. The imprint resist 110 is then cured, which may be achieved by illuminating with ultraviolet (UV) light, heating, chemically treating, or a combination of the foregoing methods. A BCP material 140 is then coated over the pillar imprinted resist 110. The imprint resist 110 is "chemically-neutral" with respect to the chemical composition of the BCP. That is, by chemically-neutral, the imprint resist has corresponding chemical components that match the BCP by having the same or similar chemical properties. The chemically neutral surface can be obtained with spin coating neutral polymer brush materials, or using self-assembled monolayers (SAMs). A consequence of chemical neutrality is that cylinders of BCP 140 will be formed in the course of the process described below that stand upright on the substrate 120 coated with imprint resist 110, whether or not the resist 110 is yet impressed to produce pillars 101 in the imprint resist 110. However, without a periodic structure to guide the growth of cylinders, there will be no long range ordering of BCP pillar structure across the substrate 120. Additionally, without a chemically neutral surface on which to deposit the BCP 140, the cylinders formed may lie in the plane of the substrate.

The BCP 140 may include two polymer components, which may be referred to as block A and Block B. The BCP 140 may be composed of a first percentage of block A and a second percentage of block B, where the total percentages may be up to or less than 100%. It follows from the condition of chemical neutrality that the imprint resist 110 be composed of a material A' that has chemically similar properties as block A and a material B' that has chemically similar properties as block B, and furthermore, that the imprint resist 110 comprises approximately the same percentages of A' and B' that comprise the constituents block A and block B of the BCP.

Figure 1B:
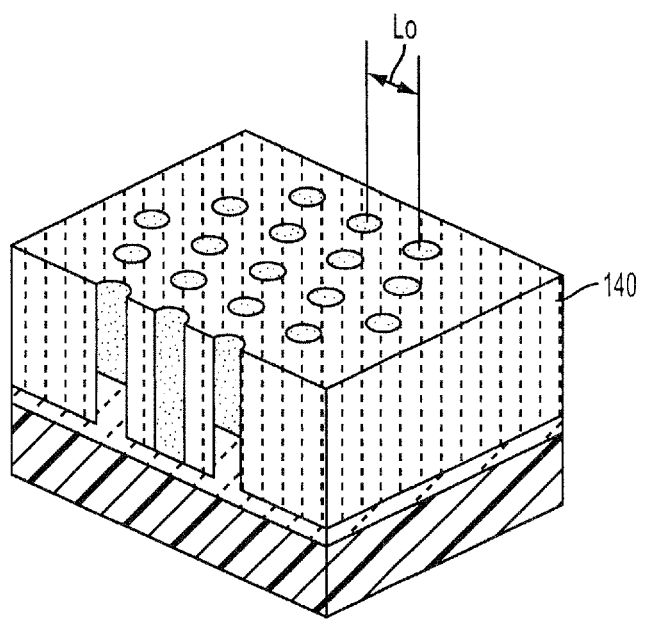
FIG. 1B illustrates an annealed BCP formed on the imprint resist, in accordance with the disclosure.

Referring to FIG. 1B, BCP 140 may be applied to the surface of the imprint resist 110 in a process that will be more fully described below. For example, the BCP 140 may be applied using spin coating, dipping, aerosol deposition, or the like, to a selected thickness. In an embodiment, the thickness may range from 30 nm to 200 nm. The BCP 140, which comprises block A polymer and block B polymer, has a natural lattice dimension, referred to as $L_o$. By choosing the pitch period $L_s$ to be an integer multiple of the natural pitch of the selected mix of block A and block B polymers, i.e., $L_s=n\times L_o$, where n is an integer (n=1, 2, 3, ... ), a process of self-assembly results in density multiplication of the number linear and areal pillar structures formed in the BCP, as described below. That is, the linear density multiplication factor is n and the areal density multiplication factor is $n^2$. For example, if n=2, a cylindrical pillar of BCP will form at each imprinted resist pillar 101, and one additional pillar will naturally form between two adjacent pillars. The areal density of pillars will be $n^2=2^2=4\times$ the areal density of the imprinted pattern of pillars 101 in the resist 110.

A low density pattern with spacing $L_s$ over a large distance will enforce long range ordering of the density multiplied features of spacing $L_o$ formed by self assembly on a mass scale, thus achieving features with dimensions determined by molecular scales, and not limited by resolution of lithographic processes or time and cost such as serial writing with e-beam lithography techniques.

The densest uniform pattern is hexagonal close pack (HCP), so that the pitch $L_s$ is the same between any two nearest neighbors of the imprinted pattern of pillars 101 in the imprint resist 110. This can result in forming the highest density possible for a selected choice of block A, block B and natural pitch $L_o$.

Figure 2A:
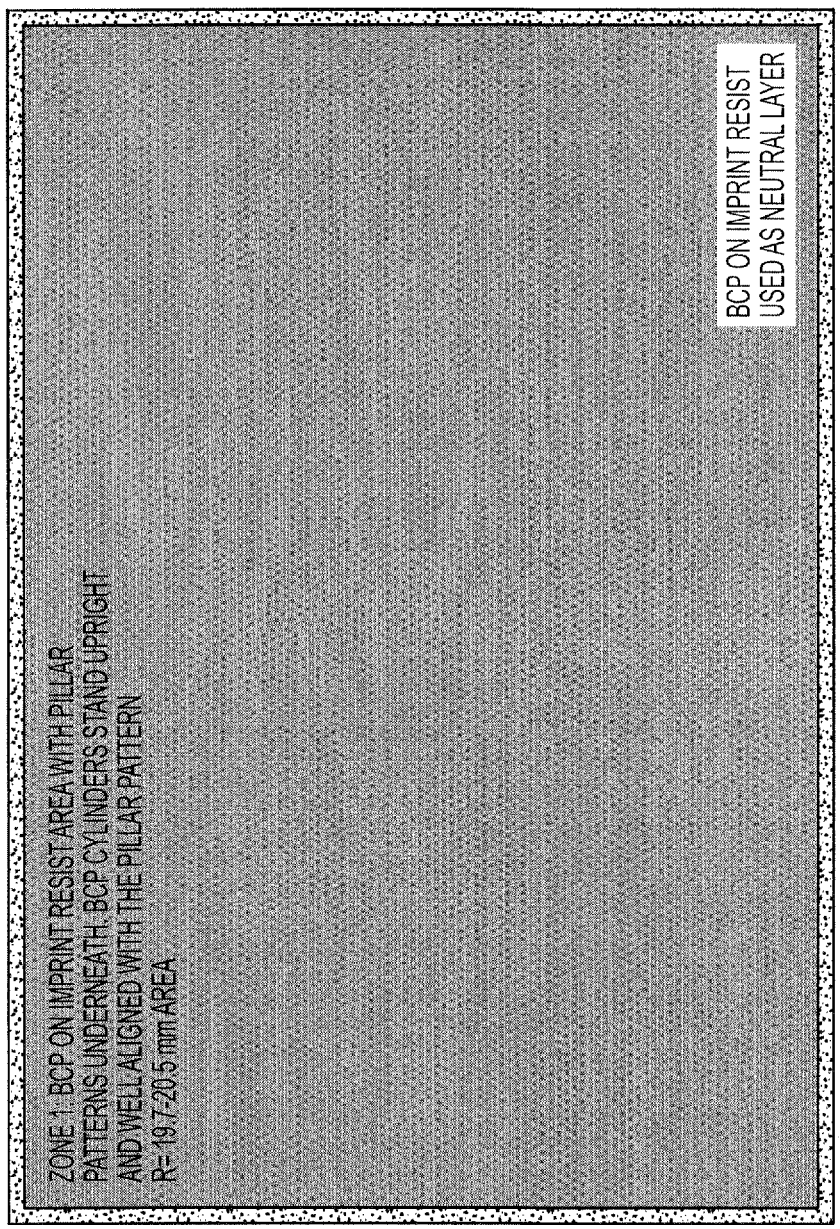
FIG. 2A is an image of BCP formed on pillar imprinted chemically neutral imprint resist, in accordance with an embodiment.

FIG. 2A is an image of BCP 140 formed on pillar imprinted chemically neutral imprint resist, where imprinted resist pillars 101 were formed with a separation according to $L_s=n\times L_o$. It can be seen (a) that long range order (i.e. HCP pattern) persists across the entire field of the image, and (b) the cylinders of BCP stand vertically from the chemically neutral imprint resist 110 and are aligned with the pillars 110.

Figure 2B:
FIG. 2B is an image of BCP formed on chemically neutral imprint resist, in which no pillars have been imprinted, in accordance with an embodiment.

FIG. 2B is an image of BCP formed on chemically neutral imprint resist, in which no pillars have been imprinted. It can be seen that (a) there is no long range HCP order in the formation of the BCP cylinders, and (b) the cylinders of BCP stand vertically from the chemically neutral imprint resist 110 and are aligned with the pillars 110.

Figure 2C:
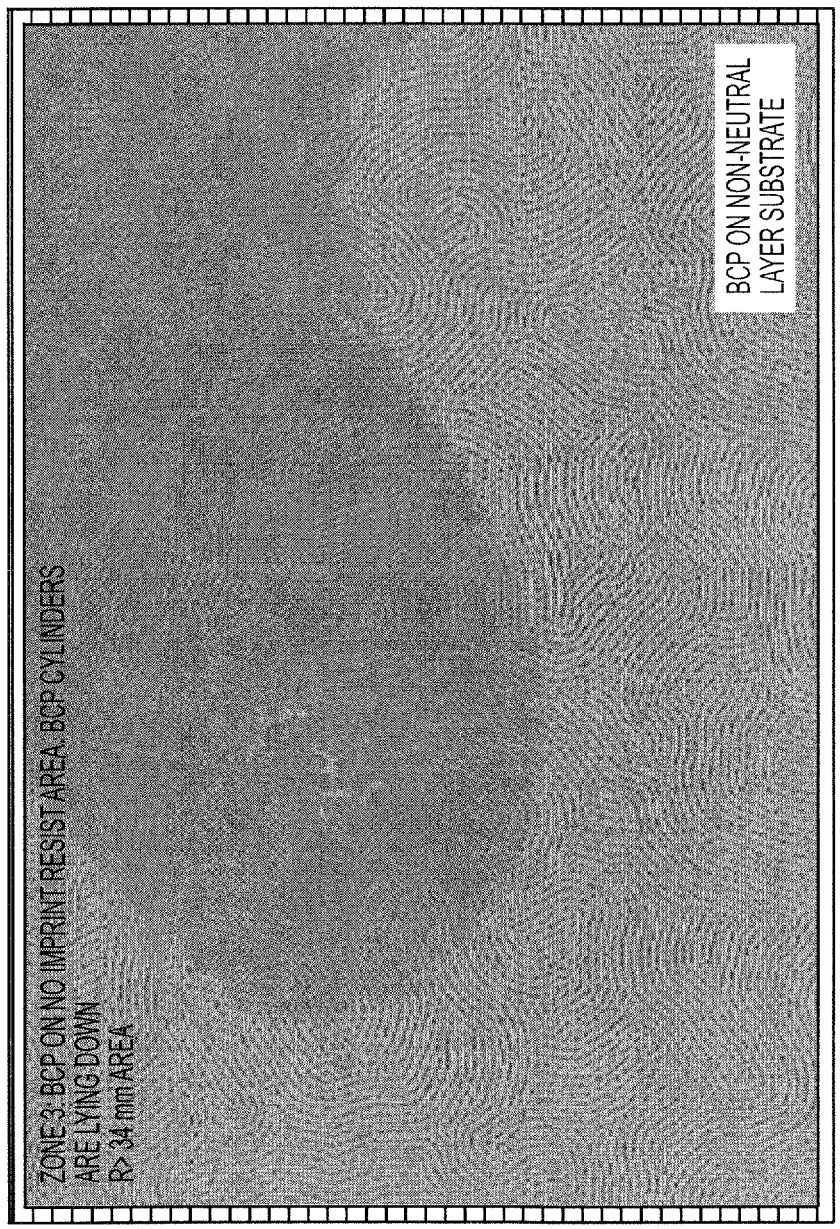
FIG. 2C is an image of BCP formed on a surface having no imprint resist.

FIG. 2C is an image of BCP formed on a substrate surface having no imprint resist. It can be seen that (a) there is no long range HCP order in the formation of the BCP cylinders, and (b) the cylinders of BCP generally lie in the plane of the substrate and do not form vertical standing columns, as in the cases illustrated in FIGS. 2A and 2B.

Figure 3:
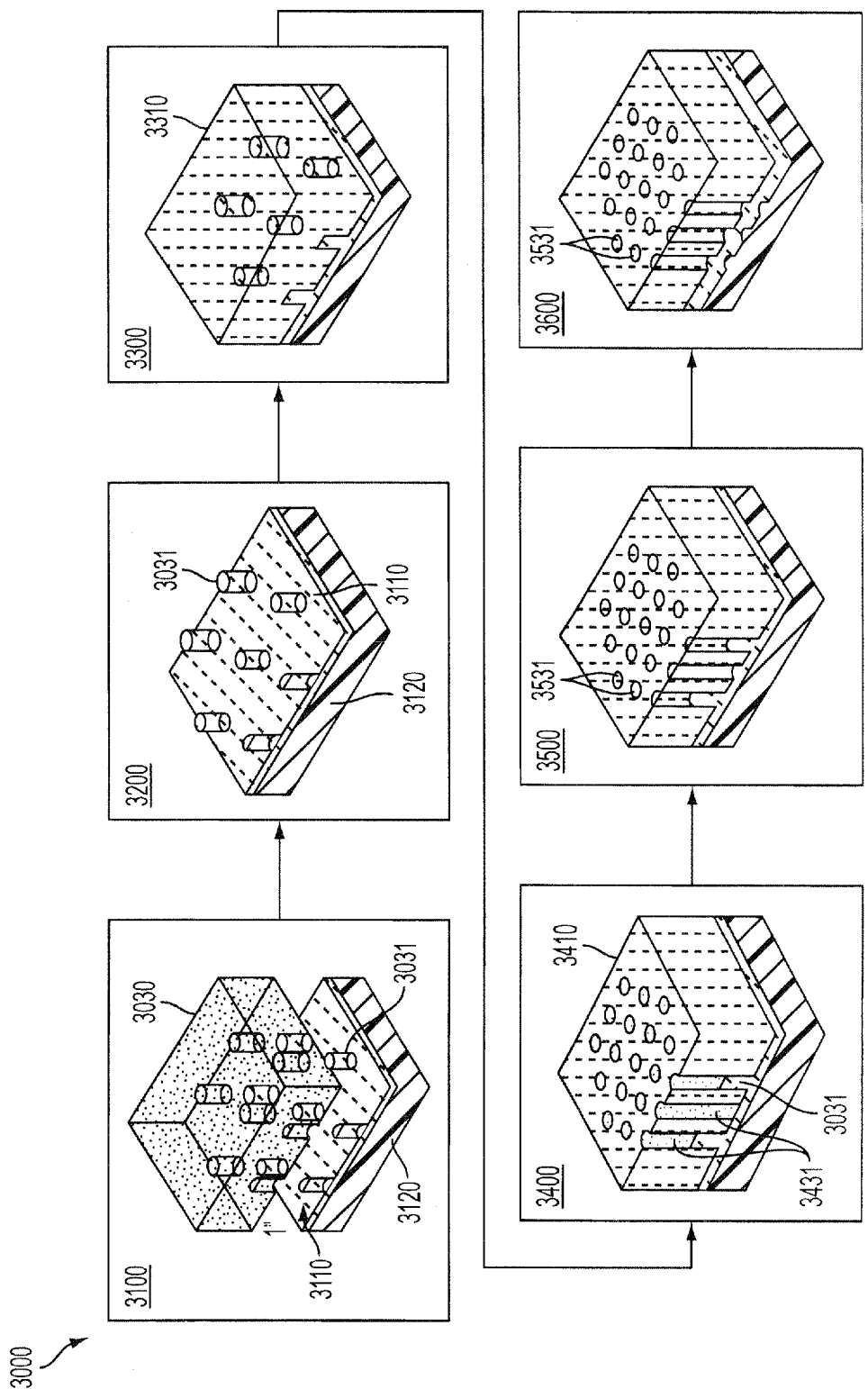
FIG. 3 illustrates an embodiment of a method for guiding the cylinder formation and density multiplication of BCP feature generation, in accordance with an embodiment.

In an embodiment, referring to FIG. 3, a method 3000 is illustrated for guiding the cylinder formation and density multiplication of BCP feature generation. In block 3100 a neutral imprint resist 3110 is deposited on a substrate. Methods of deposition include spin coating, dipping, spraying, and the like. The imprint resist 3110 may be heated to reduce viscosity. A low density pattern imprint template 3030 imprints a low density pattern of pillars 3101 in a layer of neutral imprint resist 3110 on a substrate 3120. The template 3030 may be made, for example, from quartz with pillar holes machined by any of various methods, such as lithography and plasma, reactive ion etching, or the like, where the pattern density is low (e.g., 250 Gdpsi).

The imprint resist 3110 may be a UV curing cross-linking resist. With the master mold 3030 impressed upon the imprint resist 3110, UV illumination may be applied to cross-link cure the resist. In an embodiment, the imprint resist 3110 may be a polystyrene (PS)-based or PS-like UV cross-linking resist to guide cylinder formation in polystyrene/poly(methylmethacrylate) (P(S-b-MMA)) BCP materials. For example, if block A of the BCP comprises approximately 70%, and block B comprises approximately 30%, then the imprint resist 3110 may be comprised of ~70% polystyrene with a functional group, a cross-linking agent comprising ~10-25%, and a photo initiator comprising ~1-5%. A resist of this composition range is compatible with UV imprint lithography, having a sufficient uniformity, resolution and sensitivity.

In block 3200, the imprint template 3030 is removed following UV curing to expose a pillar template having the low spatial density corresponding to the imprint template 3030.

In block 3300 a BCP comprising, for example, P(S-b-MMA) is deposited as a film 3310 onto the imprint-defined resist 3110. The deposition may be spin coating, aerosol spray, dipping, or the like. This is followed by block 3400, in which the P(S-b-MMA) film 3310 is thermally annealed at sufficient temperature and time to enable guided lateral self-assembly formation of the ordered BCP nano-patterns by lateral segregation of the block A polymers and block B polymers, resulting in nano-structure density multiplication. That is, cylinders 3431 of block B polymer may form under selected conditions by self-assembly on the imprint resist pillars 3031, as well as at integer multiples of a spacing $L_o$ between the resist pillars 3031, spaced apart by $L_s$, with block A material 3410 surrounding the block B cylinders 3431. Block B cylinder 3431 material may be, for example, PMMA, and block A material 3410 may be polystyrene (PS).

In block 3500 the PMMA is removed. This may be done, for example, by UV illumination, which degrades PMMA of block A material 3410, while cross-linking the PS block B cylinders 3431. After soaking in acetic acid for one minute to remove any impurities, residue or portions of the degraded BCP, a template of nano-pore (or via) cylinder holes 3531 in a line array is left in PS.

In block 3600 the remaining PS nano-pores may be used as a mask to remove the remaining imprint resist pillars 3031 and exposed imprint resist 3110 using any of various well-known etch or micro-machining processes to extend the nano-pore (via) pattern down to the substrate.

The columnar nano-pores (vias) 3531 thus formed may be filled with a variety of materials to suit applications, such as magnetic materials for magnetic memory, oxides and conductive metal traces for ICs, photonic structures for sub-wavelength plasmonics, or the like.

Figure 4:
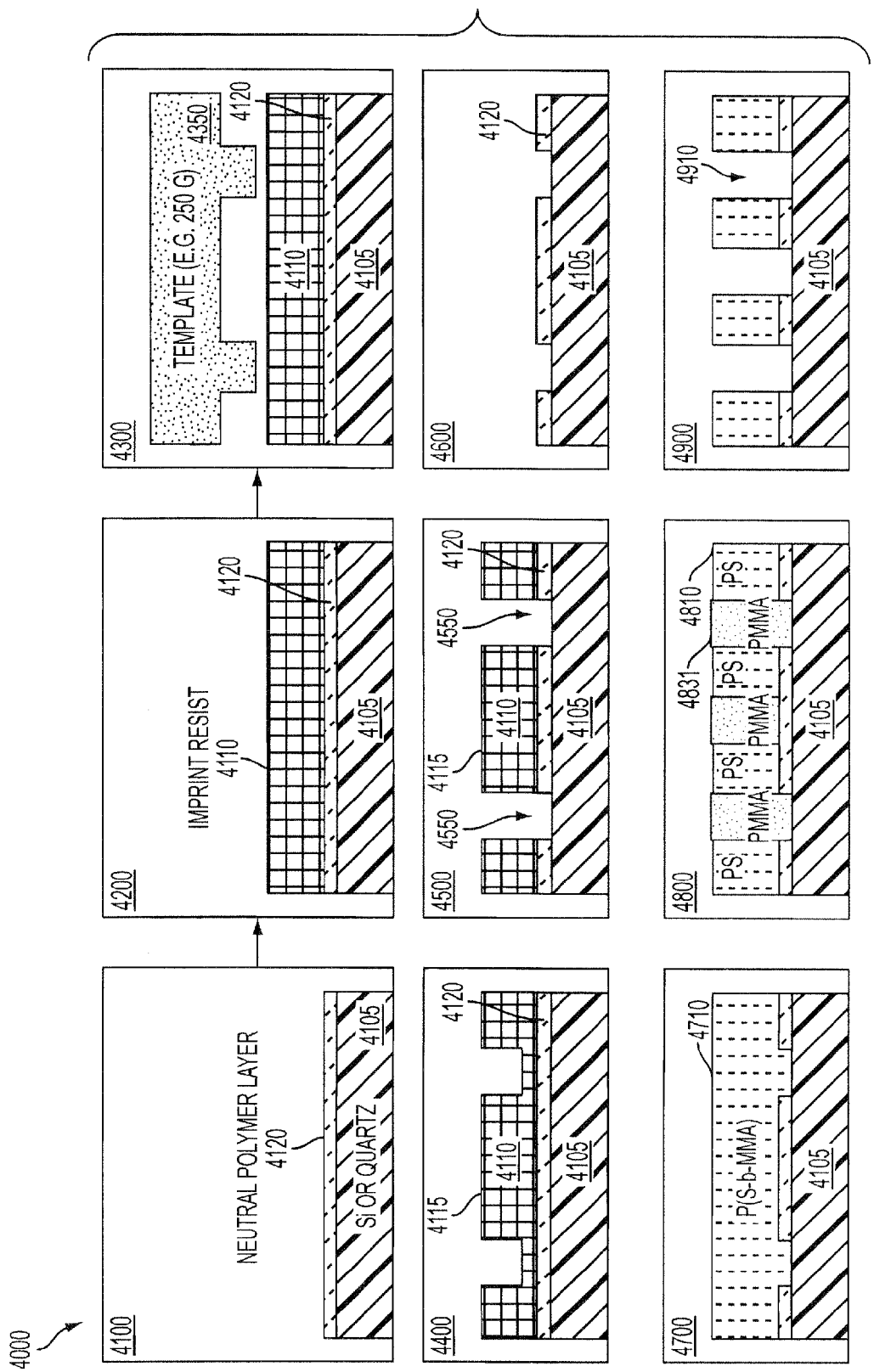
FIG. 4 illustrates an embodiment of a method for guiding the pillar formation and density multiplication of BCP feature generation, in accordance with an embodiment.

In an embodiment, referring to FIG. 4, a method 4000 is illustrated for guiding the cylinder formation and density multiplication of BCP feature generation employing an imprint lithography process. In block 4100 a neutral chemistry polymer layer 4120 may be deposited on a substrate 4105. An imprint resist 4110 is deposited on the neutral polymer layer, as shown in block 4200. In block 4300, an imprint template 4350 having a seed feature density (e.g., 250 gdsi) is impressed into the imprint resist 4110 to form imprinted resist 4115 as shown in block 4400. In block 4400 the imprinted resist 4115 is thermally annealed. A thin residue layer of imprinted resist 4115 may remain in the recessed regions created during the imprinting. Therefore, a resist thinning process, such as an oxygen reactive ion etch or a plasma may be used to descum and remove both the residue of resist in the imprinted areas and the polymer layer 4120 exposed in the recess 4550, as shown in block 4500, to expose portions of the substrate 4105. The imprint resist may be removed, as shown in block 4600, leaving the neutral chemistry polymer layer 4120 previously masked by the imprint resist 4115 covering areas not impressed by the imprint template 4350, and exposed portions of the substrate 4105.

A layer of BCP 4710 may be applied over the substrate 4105 and the remaining patterned neutral chemistry polymer layer 4120, as shown in block 4700. The BCP 4710 may be, for example, P(S-b-MMA). During a thermal annealing of the BCP, the self assembly process separates the PMMA into columns 4831 that grow in a pattern with a pitch period determined by $L_s = n \times L_o$, as shown in block 4800. In the example illustrated in FIG. 4, n=2, so that the linear density multiplication factor is 2, and the areal density factor 4× results in 4×250 gigadots/sq-in (gdsi)=1 teradots/sq-in (1 tdsi) of PMMA columns 4831 formed in the BCP starting material, surrounded by polystyrene 4810. As shown in block 4900, the PMMA is removed, leaving a pattern of holes 4910 at ~1 tdsi, similar to the UV method of curing the imprinted resist, as shown in the result illustrated in block 3600 of FIG. 3.

The holes 4810 may then be filled with a variety of materials, depending on the applications, e.g., magnetic memory, plasmonics, conductive features, insulators, and the like.

Figure 5:
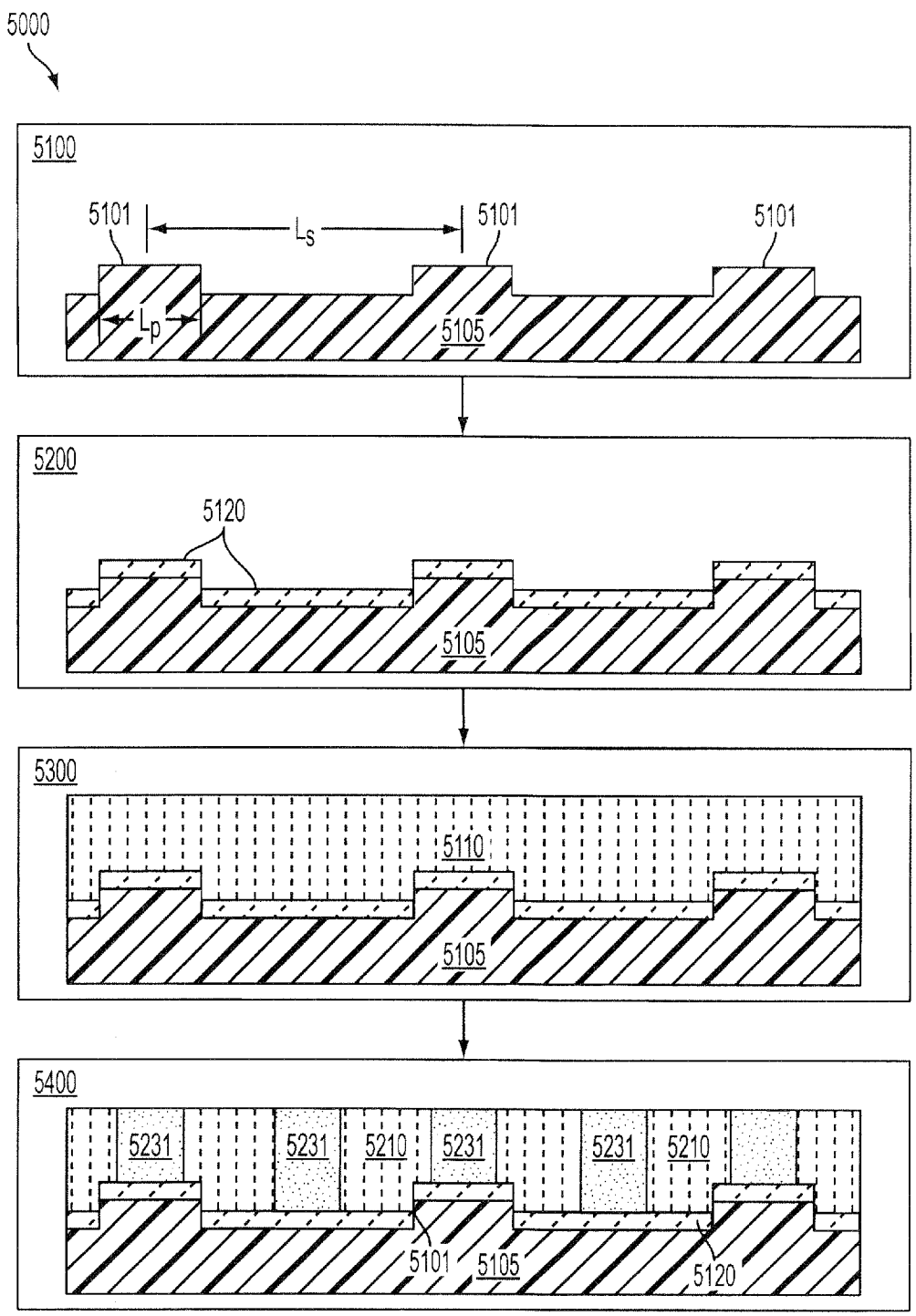
FIG. 5 illustrates steps in an embodiment of a method for guiding the pillar formation and density multiplication of BCP feature generation, in accordance with an embodiment.

The method of forming columnar structures may be applied more generically to substrates where any pillar feature formed by patterning of a selected periodicity, or due to a naturally occurring periodicity on the substrate. The pitch of the pillar features and the natural pitch $L_0$ of the BCP may be in integer relationship to each other. For example, FIG. 5 illustrates an embodiment of a method 5000 for guiding the pillar formation and density multiplication of BCP feature generation, where the pillar feature dimension is not in one-to-one correspondence with the cylinder of polymer that is formed on the pillar by self assembly during annealing. In block 5100 a substrate 5105 having a pattern pillar features 5101 of well defined pitch $L_s$ and pillar feature dimension $L_p$ is established or occurs naturally. A neutral chemistry resist 5120 is coated on the already established pattern in block 5200. A selected BCP is deposited on the neutral chemistry resist 5120 coated substrate 5105 in block 5300. During annealing, in block 5400, by lateral segregation and self-assembly, cylinders 5231 of block B polymer form on the periodic pillar structures separated by a distance $L_s$ and at integer multiples of the natural pitch $L_o$ dimension in between according to the relationship $L_s = n \times L_o$, and surrounded by block A polymer. The selection of block A and block B materials determines the natural pitch of feature formation. The pillar feature dimension $L_p$ does not play a constraining role. When the relationship $L_s = n \times L_o$ is satisfied and the feature pillars are in HCP structure at low density, the cylinders 5231 grow in HCP configuration with long range order dictated by the initiating pillar feature 5101, but with BCP areal feature density multiplied by $n^2$.

In another embodiment, it may be desirable to form dense line arrays, such as a high density array of electrically conductive or optical line traces on a substrate. In such case, the methods described above may be applied, with proper selection of polymer block components and stoichiometric mixtures, to form linear patterns, where one component (e.g., PMMA) is removed and the troughs are formed that may be filled with conductors, optical waveguides, insulators, or the like.

Figure 6:
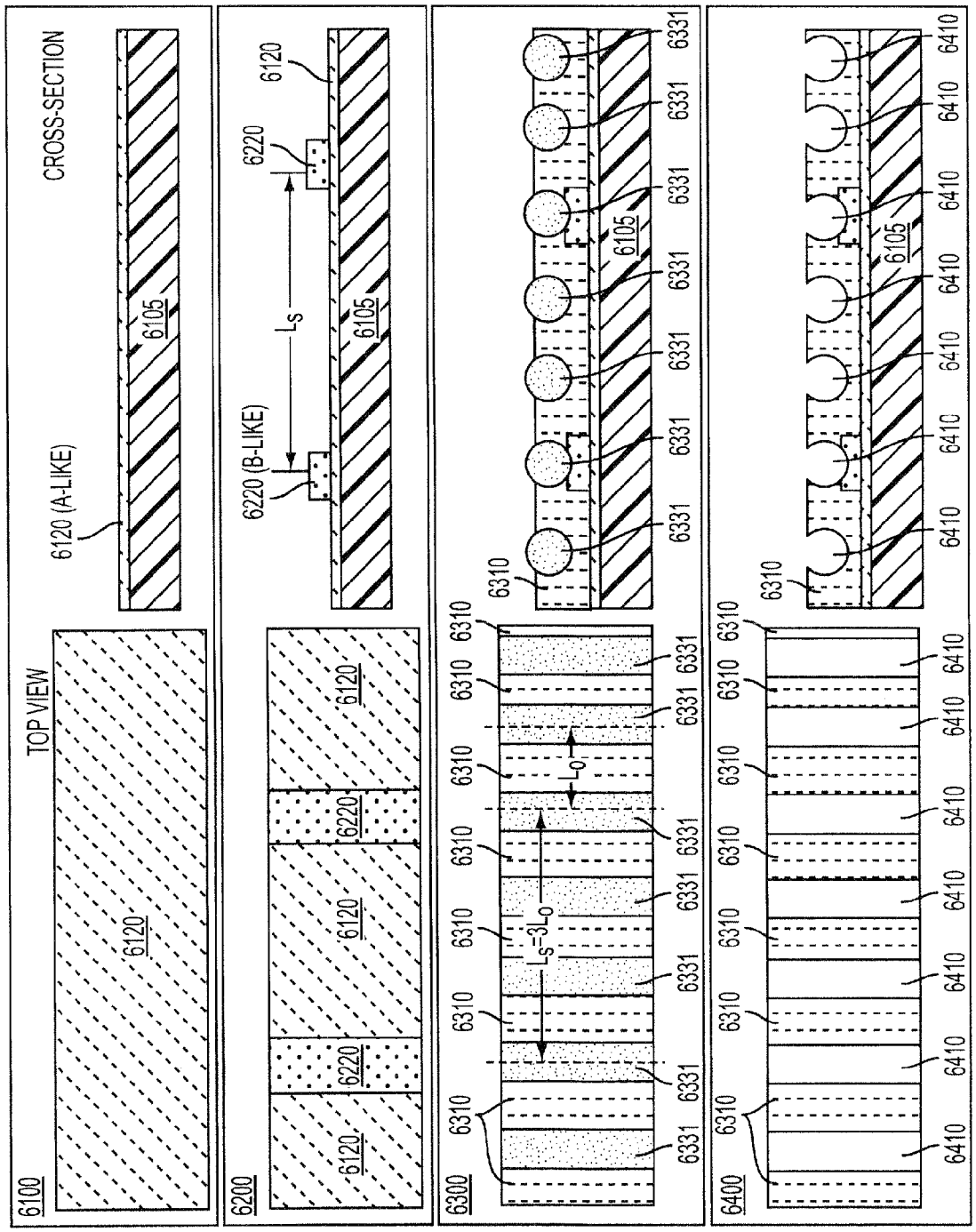
FIG. 6 illustrates steps in an embodiment of a method for guiding the pillar formation and density multiplication of BCP feature generation to form line features, in accordance with an embodiment.

FIG. 6 illustrates an embodiment of a method 6000 for guiding a density multiplication self-assembly trough structure formation and of BCP using feature generation to form line structures on a substrate. In block 6100, a "block A-like" polymer layer 6120 is formed on a substrate 6105. The substrate may be an insulator, semiconductor, semimetal, and metal, or a composite of these materials. The A-like polymer layer may be 5-10 nm thick, but thicker or thinner films may be deposited. In block 6200 a layer of "block B-like" resist or polymer material may be deposited and patterned using imprint lithography to form a low density array of ridges 6220, where the resist between the ridges 6220 is removed, using methods such as chemical processing, oxygen reactive ion etching or oxygen plasma ashing, exposing areas of block A-like polymer.

In block 6300, a BCP comprising block A polymer and block B polymer (e.g., P(S-b-MMA)) components is applied to form a layer over the ridges 6220 and the polymer layer 6120, and then thermally annealed to form self-assembled separate alternating regions of block B polymer 6331, for example, PMMA, and surrounding region A polymer 6310, for example polystyrene. In the example of FIG. 6, n=3 for the selection of polymer components and feature spacing $L_s$. In block 6400, one component of annealed material (e.g., block B PMMA) is removed, leaving troughs that may then be filled with electrical, optical, or other material, depending on the application.

It may be readily appreciated that if the chemistry of the block A-like polymer is not neutral to both A and B block polymers, as described in embodiments above, but layer 6120 is rather is more like block A polymer of the BCP, upon annealing the block. A polymer may lie down in the plane of the substrate 6105 on the A-like layer 6120, parallel to—and between—the long direction of the ridges 6220, forming lines with a pitch $L_o$. Similarly, upon annealing, the B-like resist may attract the B block polymer of the BCP to self segregate and form over the pillars 6220 as columns that lie flat in the plane of the substrate 6105 parallel to the long direction of the pillars 6220, as well as in parallel integer multiples of n rows between the ridges 6220, as described above. The block B polymer 6331 may be removed by various methods in block 6400, including by wet chemistry, oxygen plasma or RIE, or the like, and the troughs 6410 may be filled with another material.

It may be readily appreciated that the combined use of low density imprint templates, neutral chemistry resist and/or polymers, non-neutral chemistry resists and/or polymers and the density multiplication capability available in block copolymer annealing can provide high density structure fabrication that can reduce the costs of fabricating such structures associated with using high density e-beam lithography to direct write such features to a substrate. Such direct write e-beam processes can take hours or days to execute a single template, and requires stringent position control during writing that may go beyond currently available optical interferometric motion control technology. The method may reduce defect density that may arise in such structures due to the ablative process in e-beam lithography.

It is to be understood that the specific order or hierarchy of steps in the methods disclosed is an illustration of example processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method comprising
    modifying a surface of a first layer comprising a first pattern of features at a first feature density, wherein the first layer overlies an underlying substrate;
    depositing a block copolymer composition over the first layer;
    annealing the block copolymer composition to self-assemble a first polymer block and a second polymer block,
        wherein the first polymer block has a chemical preference for forming over the features of the first layer;
    removing the first polymer block to form a second layer comprising a second pattern of features at a second feature density, wherein
        the first pattern of features includes pillar features,
        the removing the first polymer block exposes the first pattern of features of the first layer within the second pattern of features, and
        the second feature density is greater than the first feature density; and
    removing the first pattern of features of the first layer from the second pattern of features, wherein removing the first pattern of features exposes the underlying substrate.

2. The method of claim 1,
    wherein the first layer comprises an imprinted resist layer.

3. The method of claim 2,
    wherein modifying the surface of the first layer comprises applying a polymer brush to the surface of the first layer.

4. The method of claim 2,
    wherein modifying the surface of the first layer comprises applying a self-assembled monolayer to the surface of the first layer.

5. The method of claim 1,
    wherein the block copolymer composition comprises polystyrene-block-polymethylmethacrylate.

6. The method of claim 1,
    wherein removing the first polymer block comprises removing polymethylmethacrylate.

7. A method comprising
    depositing a block copolymer composition over a first layer comprising a first pattern of features at a first feature density;
    annealing the block copolymer composition to self-assemble a first polymer block and a second polymer block,
        wherein the first polymer block has a chemical preference for forming on the features of the first layer; and
    removing the first polymer block and portions of the first layer underlying the first polymer block to form a second layer comprising a second pattern of features at a second feature density, wherein
        the first pattern of features includes pillar features,
        the second feature density is greater than the first feature density,
        the second layer overlies the first layer, and
        the second pattern of features exposes the underlying substrate.

8. The method of claim 7,
    wherein a surface of the first layer is modified to provide the first polymer block the chemical preference for forming over the features of the first layer.

9. The method of claim 8, further comprising
    applying a polymer brush or a self-assembled monolayer to modify the surface of the first layer prior to depositing the block copolymer composition.

10. The method of claim 7,
    wherein the features of the first layer are ridges on the first layer, and
    wherein the features of the second layer are troughs in the second layer.

11. The method of claim 7,
    wherein the features of the first layer are columns on the first layer, and
    wherein the features of the second layer are columnar holes in the second layer.

12. The method of claim 7,
    wherein the second feature density is about 1 teradots/in$^2$, and
    wherein the first feature density is about 250 gigadots/in$^2$.

13. A method comprising
    modifying a surface of a first layer comprising a first pattern of features at a first feature density wherein the first pattern of features includes pillar features;
    depositing a block copolymer composition over the first layer;
    annealing the block copolymer composition to self-assemble a first polymer block and a second polymer block,
        wherein the first polymer block has a chemical preference for forming over the features of the first layer;

removing the first polymer block to form a second layer comprising a second pattern of features at a second feature density, wherein
- the removing the first polymer block exposes the features of the first pattern within the second pattern of features,
- the second feature density is greater than the first feature density;

removing the features of the first pattern from the second pattern of features, thereby forming nano-pore cylinder holes in a line array, wherein the nano-pore cylinder holes extend through the first layer and expose an underlying substrate; and filling the nano-pore cylinder holes with a material.

14. The method of claim 13,
wherein modifying the surface of the first layer comprises applying a polymer brush or a self-assembled monolayer to the surface of the first layer.

15. The method of claim 14,
wherein the block copolymer composition comprises polystyrene-block-polymethylmethacrylate.

16. The method of claim 15,
wherein the features of the first layer are imprinted columns on a resist-based first layer, and
wherein the features of the second layer are columnar holes in a polystyrene-based second layer.

17. The method of claim 16,
wherein the second feature density is about 1 teradots/in$^2$, and
wherein the first feature density is about 250 gigadots/in$^2$.

* * * * *